(12) United States Patent
Signorelli et al.

(10) Patent No.: US 6,590,414 B2
(45) Date of Patent: Jul. 8, 2003

(54) CIRCUIT ARCHITECTURE FOR PERFORMING A TRIMMING OPERATION ON INTEGRATED CIRCUITS

(75) Inventors: Tiziana Signorelli, S. Giovanni La Punta (IT); Francesco Pulvirenti, Acireale (IT); Calogero Ribellino, Sommatino (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/996,082

(22) Filed: Nov. 28, 2001

(65) Prior Publication Data

US 2002/0080658 A1 Jun. 27, 2002

(30) Foreign Application Priority Data

Nov. 30, 2000 (EP) .............................. 00830795

(51) Int. Cl.[7] ................................. G06F 7/38
(52) U.S. Cl. .............................. 326/37; 326/47; 326/46
(58) Field of Search .............................. 326/37, 38, 41, 326/46, 47

(56) References Cited

U.S. PATENT DOCUMENTS 5,396,130 A * 3/1995 Galbraith et al. ........... 326/102
5,671,183 A * 9/1997 Soenen et al. ......... 365/189.12
6,151,238 A   11/2000 Smit et al.

OTHER PUBLICATIONS

European Search Report dated Jul. 26, 2001 for European Application No. 00830795.

* cited by examiner

Primary Examiner—Michael Tokar
Assistant Examiner—Anh Tran
(74) Attorney, Agent, or Firm—Lisa K. Jorgenson; Jose Gutman; Fleit, Kain, Gibbons, Gutman & Bongini P.L.

(57) ABSTRACT

A circuit architecture and a method for performing a trimming operation directly on an application board, or after the operation of packaging integrated electronic devices. The circuit architecture includes at least one non-volatile memory unit (3) having non-volatile memory elements (5) and a circuit (17, 19) for modifying the state of the memory elements (5), a first multifunctional input pin (8) whereon a sequence (25) of trimming data is received, a second multifunctional input pin (9) whereon a timing signal of the trimming operations is received, and an additional access pin (7) for switching the circuit architecture operation from a normal mode over to a trimming mode. This circuit architecture further includes a volatile memory unit (2) associated with the non-volatile memory unit (3) for storing the non-volatile memory (3) state at power-on or at a simulating phase, and storing the sequence (25) of trimming data at a programming phase; an interface (6) is provided between the first multifunctional input pin (8), the second multifunctional input pin (9), and the additional access pin (7), the at least one non-volatile memory unit (3), and the volatile memory unit (2), for initially storing the sequence of trimming data (25) into the volatile memory unit (2) and subsequently timing the trimming operation.

23 Claims, 2 Drawing Sheets

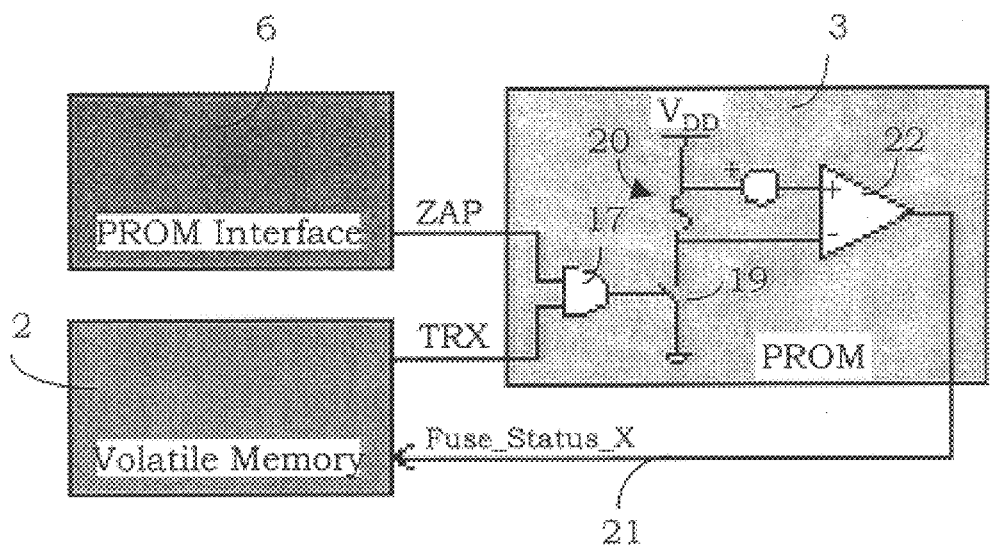
FIG. 2
FIG. 3A
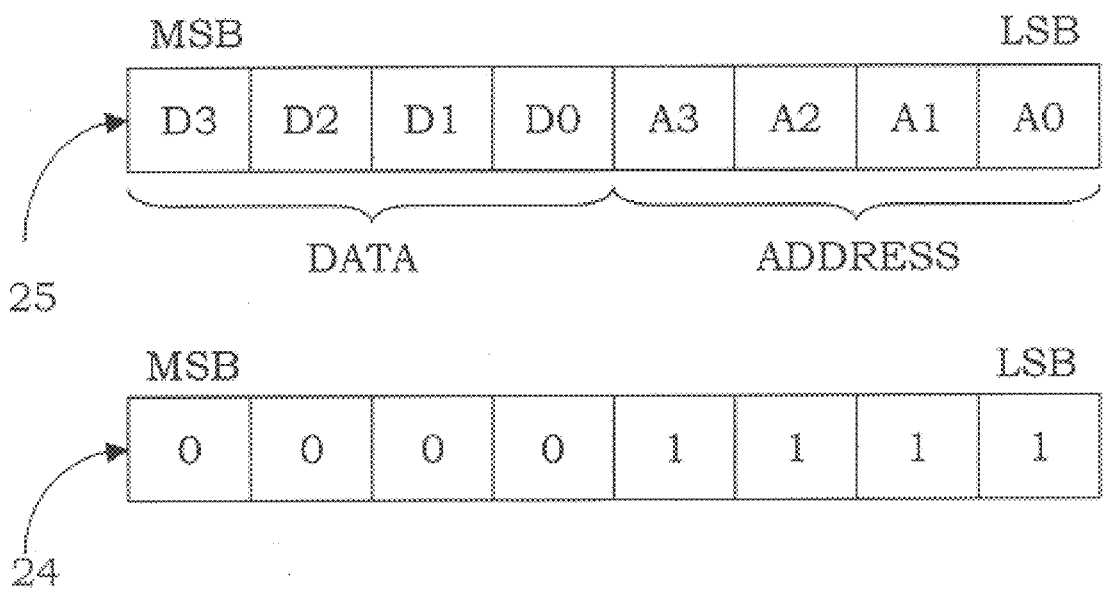
FIG. 3B

CIRCUIT ARCHITECTURE FOR PERFORMING A TRIMMING OPERATION ON INTEGRATED CIRCUITS

CROSS-REFERENCE TO RELATED APPLICATIONS

This application is based upon and claims priority from prior European Patent Application No. 00830795.1, filed on Nov. 30, 2000, the entire disclosure of which is herein incorporated by reference.

BACKGROUND OF THE INVENTION

1. Field of the Invention

This invention relates to a circuit architecture for performing a trimming operation directly on an application board or, optionally, after the operation of packaging integrated electronic devices.

More particularly, the invention relates to an architecture as above, comprising at least a non-volatile memory unit having non-volatile memory elements and a means for changing the state of the memory elements, a first multi-functional input pin whereon a sequence of trimming data is received, and at least an additional access pin.

The invention relates, particularly but not exclusively, to a circuit architecture incorporated in a "housekeeping" integrated electronic device for a desktop computer, which circuit architecture operates to control and monitor output voltages from the secondary of a supply switch, known as Switching Power Supply.

The invention further relates to a method for performing trimming operations on the above integrated device with the purpose of enhancing its accuracy and turning on/off particular functions thereof.

2. Description of the Related Art

As it is well known in this specific technical field, today's integrated circuits must meet ever-stricter specifications in regard to the ever-increasing number of parameters which require accurate determination and adjustment at the end of an integrated circuit manufacturing process. To achieve the required accuracy, it is necessary to make device trimming operations at the end of the manufacturing process, that is, on the application board and/or during the so called final test.

There are several methods to make trimming operations "under cover", that is when the integrated circuit has already been assembled in the corresponding protective package.

One such method is described, for example, in the European Patent Application No. 99830579.1, which has been assigned to the same assignee as the present patent application.

A second prior art solution is described in the Patent Application No. 00830059.2, which has also been assigned to the same assignee as the present patent application. In the former of the above patent applications, are described both a circuit architecture suitable for final test trimming, and its advantages compared to the better known electrical wafer sort trimming method.

The trimming method of the Application 99830579.1 uses two pins of the integrated circuit: a first pin for entering the trimming mode of the device, and the other for serially entering the data which, once permanently stored into memory elements, will allow certain basic parameters of the integrated circuit to be modified and set.

The circuit architecture comprises a serial interface which receives as input a string of data having a length depending on the number of memory elements to be programmed. The string of data contains a field for the data to be stored in the memory elements, a field for string control, and the information for selecting the simulation or the trimming operation.

Data acquisition is clocked by a fixed frequency clock signal which is generated internally in the integrated circuit, and the logic state (0, 1, or an end-of-sequence signal STOP) of each data is recognized in function of the distance separating one leading edge from the next in the data sequence. The string of data is first acquired and decoded, and is then loaded into a shift register, ready to be used for a trimming simulation or an actual trimming. All these operations are managed and coordinated by a state machine from the inside of the circuit. A major advantage of this first solution resides in that the trimming operation can be carried out at the final testing stage without additional pins, and in that the result can be simulated before the actual trimming, in order to check the effect of the bit sequence entered on the parameters to be set.

On the other hand, such solution has the following disadvantages:

the protocol is based on the use of an internal clock signal which makes this solution inapplicable to those devices lacking any internal or integrated clock generator;

once the data string is entered, the entered data simulation or the modified parameters measured, can be carried out only after having restored the device to its normal mode of operation; and the simulation and trimming operations are reciprocally exclusive, and in order to trim a sequence of data which has been previously simulated, the whole string of data must be re-entered, which is time-consuming and impracticable with very long strings, that is in case a large number of memory elements require to be programmed.

The prior art solution set forth in the Application No. 00830059.2 exhibits the same drawbacks, to a greater or lesser extent.

An underlying technical problem has been to provide a circuit architecture for performing a trimming operation directly on an application board, or optionally after the operation of packaging integrated electronic devices, with such structural and functional features as to allow trimming operations to be performed also on devices which have no internal clocks, thereby overcoming the aforementioned drawbacks of the prior art.

Accordingly, there exists a need for overcoming the disadvantages of the prior art as discussed above.

SUMMARY OF THE INVENTION

According to a preferred embodiment of the present invention, a trimming architecture comprises a special pin arranged for receiving a trimming operation timing signal, and with a volatile memory unit for storing a sequence of trimming data at the simulation phase, before the actual trimming operation is performed by a phase of programming the non-volatile memory unit.

According to a preferred embodiment of the present invention, a circuit architecture performs a trimming operation directly on an application board, or after the operation of packaging integrated electronic devices, being of the type comprising at least one non-volatile memory unit having non-volatile memory elements and a means for modifying the state of the memory elements, a first multifunctional input pin whereon a sequence of trimming data is received, and at least one additional access pin, wherein it comprises a volatile memory unit associated with the non-volatile memory unit, a second multifunctional input pin whereon a timing signal of acquisition of the data is received, an interface between the first and second pins and the memory units in order to allow a data sequence to be stored into the volatile memory unit and the data acquisition to be timed, the access pin serving to switch the circuit architecture operation from the normal mode over to the trimming mode.

According to a preferred embodiment of the present invention, a method is provided for performing a trimming operation directly on an application board, or after the operation of packaging integrated electronic devices comprising at least one non-volatile memory unit having non-volatile memory elements and a means for modifying the state of the memory elements, a first multifunctional input pin whereon a sequence of trimming data is received, and at least one additional access pin, wherein the method comprises the steps of:

storing, in a volatile memory unit associated with the non-volatile memory unit, the state of the non-volatile memory at power-on or at the simulation phase, and further storing the sequence of trimming data at the programming phase;

switching a device operation from a normal mode to a trimming mode, through the at least one additional access pin;

timing the acquisition of the data sequence through a second multifunctional input pin whereon a timing signal is received; and performing a trimming operation by modifying the state of the memory elements, following a comparison of a predetermined string of bits with the contents of the data sequence.

The features and advantages of the circuit architecture and the trimming method according to the present invention will be apparent from the following description of preferred embodiments thereof, given by way of non-limiting example with reference to the accompanying drawings.

BRIEF DESCRIPTION OF THE DRAWINGS

FIG. 2 shows a schematic view of a detail of the circuit architecture shown in FIG. 1.

FIG. 3A shows an exemplary memory word as stored in the circuit architecture of FIG. 1.

FIG. 3B shows a specific string of bits present in the circuit architecture, according to a preferred embodiment of the present invention, and utilized to enable the trimming operation.

DESCRIPTION OF THE PREFERRED EMBODIMENTS

Figure 1:
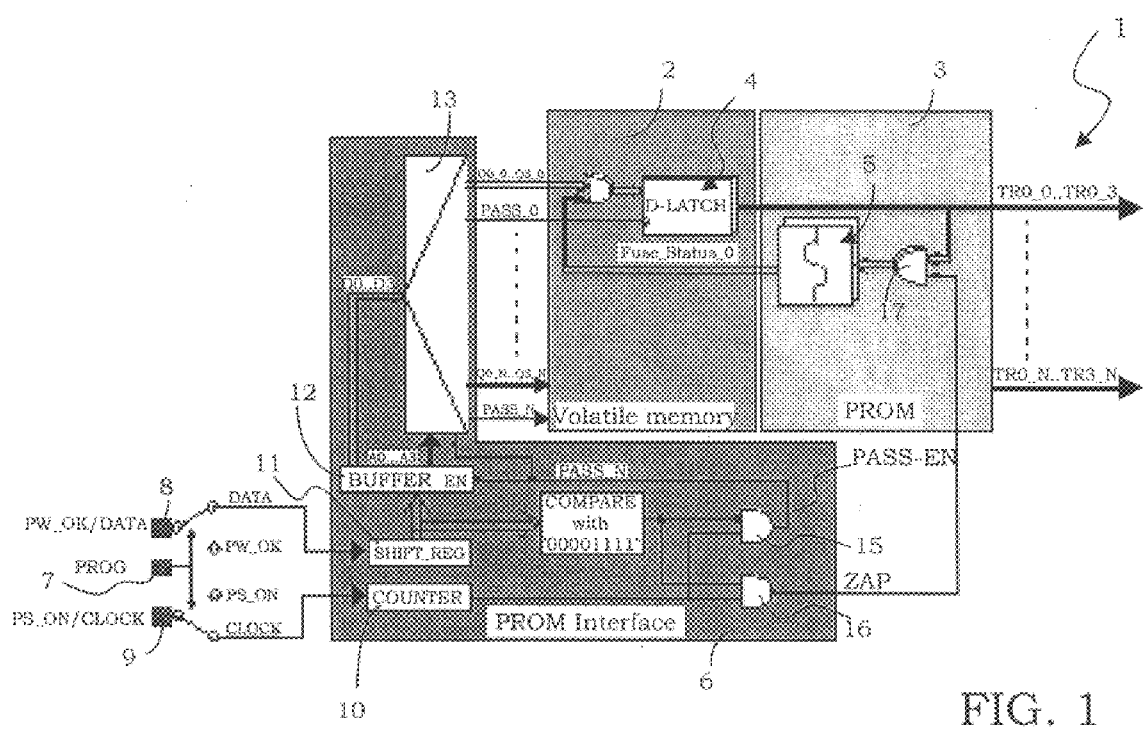
FIG. 1 shows a schematic view of a circuit architecture according to a preferred embodiment of the present invention.

With reference to the drawings, in particular to FIG. 1 thereof, a circuit architecture for performing a trimming operation directly on an application board or, optionally, after the operation of packaging integrated electronic devices, is generally shown at 1 in schematic form and according to this invention. Trimming under cover generally denotes here an operation for adjusting and setting certain basic parameters of the integrated device which incorporates the circuit architecture 1, also after the packaging operation is completed.

The circuit architecture 1 of this invention is shown in FIG. 1 to comprise essentially three main units or blocks referenced with the numerals 2, 3 and 6.

A first block 2 comprises a volatile memory. Specifically, the block 2 comprises an array of memory elements 4 represented by registers of the DT type, i.e. elements 4 of the D-latch type. The array is organized into modules, it being possible for the number of modules provided to vary according to the programmability degree considered for the circuit architecture, while leaving the general trimming architecture unchanged.

The information to be driven to the trimming outputs is stored into the D-latch elements 4. This information is obtained by decoding a memory word which is supplied from other blocks of the circuit architecture 1, as explained hereinafter.

A second block 3 comprises a non-volatile PROM (Programmable Read-Only Memory) consisting of an array of memory elements 5. The array in the block 3 is also organized into modules, and a D-latch element 4 of the block 2 is arranged to correspond univocally to each memory element 5.

The modular construction of the blocks 2 and 3 allows the size of the arrays to be adjusted to meet a user's own requirements.

In a preferred non-limitative embodiment, the elements 5 are implemented by polysilicon fuses which require neither complicated handling circuitry nor additional masks compared to those needed for the basic manufacturing process of the integrated circuit. Of course, both the array in block 2 and the array in block 3 are conventionally associated with respective tuning parameters for reading from and writing into each memory element 4 or 5.

The block 6 provides an interface, indicated as PROM Interface in the drawings, for the memory blocks 2 and 3. More particularly, an SPI protocol used for managing the read-only memory 3 is implemented in the block 6.

In this invention, moreover, the circuit architecture 1 employs three access pins, two of which are multifunction pins:

A first pin (PROG) 7 is used for switching the device from a normal operational mode to a program or trimming mode, and vice versa;

A second pin (PW_OK/DATA) 8 is used for entering memory words into the volatile memory block 2.

The third pin (PS_ON/CLOCK) 9 is to receive a timing or clock signal. By the first pin (PROG) 7 allowing the conduction paths which set off the pin 8 and 9 to be switched over, the other two pins 8 and 9 can be utilized also for different functions when the device is in its normal operational state.

The pin 8 is coupled to a shift register (SHIFT_REG) 11 inside the interface block 6. The output of this shift register is coupled to a multiplexer 13 through a buffer unit 12.

The multiplexer 13 routes the memory words to the addressed module of the volatile memory block 2.

The output of the shift register 11 is also branched to a comparator block 14 which contains a string 24 of comparison bits and has an output applied to corresponding inputs of a pair of logic gates 15 and 16.

The output of the first logic gate 15 is connected to the buffer unit 12 for delivering an enable signal PASS_EN thereto. The output of the second logic gate 16 is connected to a plurality of enable gates 17 inserted in the memory block 3 with the purpose of delivering a signal ZAP to enable the storage into the various elements 5. More particularly, the signal ZAP enables the fuses which perform the memory elements 5 to be "blown" via the logic gates 17.

The pin 9 is coupled to a counter (COUNTER) 10 inside the interface block 6. The output from the counter 10 is applied to corresponding inputs of each of the logic gates 15 and 16.

FIG. 2 shows in greater detail the interconnection layout of the main blocks 2, 3 and 6 of the inventive circuit architecture.

A multiple connection 18 links the volatile memory block 2 to the non-volatile memory block 3. More particularly, each logic gate 17 receives a signal TRX from the memory block 2 on one input, and a signal ZAP from the interface 6 on another input.

The output from the logic gate 17 controls a switch 19 to close and allows to apply a blowing voltage or current to a fuse 20 representing a non-volatile memory element 5.

The opposite ends of the fuse 20 are connected to respective inputs of a read operational amplifier 22 having its output feedback-connected to the volatile memory block 2 through a plurality of connections 21 on which a signal FUSE_STATUS_X is transmitted.

The operation of the circuit architecture 1 according to the invention will now be described. When the circuit architecture is in its programming mode, it is able to receive trimming data from the outside. The clock signal is inserted through the pin (PS_ON/CLOCK) 9 and the memory words are inserted through the pin (PW_OK/DATA) 8.

At each trailing edge of the clock signal, the counter 10 inside the interface 6 will count up, and the input memory word will be read and loaded into the register (SHIFT_REG) 11 bit-by-bit. After eight clock periods—the memory word being of eight bits—the word is completely transferred into the buffer unit 12, and at the same time is compared with a so-called zapping memory word.

If the configuration of the word entered corresponds to the bit sequence "00001111", then the zapping signal ZAP is issued to cause the fuses to be blown in the memory block 3.

Otherwise, the word is decoded into a field ADDRESS A0, . . . , A3 and a field DATA D0, . . . , D3, and these fields are input to MULTIPLEXER 13.

The field ADDRESS univocally selects a set of outputs of the MULTIPLEXER 13 which essentially correspond to one module of the volatile memory in the block 2. Indeed, the field DATA is transferred onto the selected output lines together with the signal PASS_EN which enables that same module.

The configuration of the field DATA is stored into the elements 4 (D-LATCH) of the selected module, upon the trailing edge of the signal PASS_EN. The signal PASS_EN is generated by the logic gate 15, on completion of a count in the counter 10 and when the string entered through the pin 8 is different from the bit sequence of the string 24. Such configuration is retained on the trimming outputs until the device is turned off.

When the interface 6 generates the signal ZAP, all the information contained in the volatile memory 2 is dumped permanently into the non-volatile memory 3. The fuse blowing circuits are enabled, and for each logic high '1' on the output of the elements (D-LATCH) 4, a current of sufficient strength (−250 mA) to blow the corresponding fuse is brought to work.

Because of the high current intensity required for this phase of programming the memory 3, the fuses preferably would not be blown simultaneously in all the modules of the memory block 3, but rather in a predetermined order sequence, whereby the fuses are blown one at a time. During this phase, the information stored in the elements (D-LATCH) 4 is retained on the trimming outputs.

For an appreciation of the function of the feedback connection 21 which conveys the signal Fuse_Status_X from the non-volatile memory 3 to the volatile memory 2, the procedure for initializing the trimming circuitry at start-up of the inventive circuit architecture should be taken into account.

To lower the power consumption of the read cells in the non-volatile memory block 3, the data contained in the memory 3—which data is obtained by suitably sensing the state of the fuses—is stored into the elements (D-LATCH) 4 of the volatile memory block 2 each time that the device is turned on again.

This data is also retained on the trimming outputs so that the fuse sensing cells, which are only brought to work during the start-up transient, can be disabled.

The state of the fuses 20 are sensed by comparing the ohmic value of each fuse with the one of a reference resistance having a suitable value. The sensed value will be conventionally a low logic level if the fuse has not been blown, i.e. if its ohmic value is less than a reference resistance. Otherwise, i.e. if the fuse ohmic value exceeds the one of the reference resistance, it will be a high logic.

The protocol used for managing the memory spaces is a simplified version of an SPI (Serial Peripheral Interface) protocol. For the purpose, a series of eight bits in a memory word 25 are used as shown in FIG. 3A.

As shown in FIG. 3B, an additional memory word 24, or rather a string of bits termed zapping word hereinafter, is used with a fixed configuration of logic values "00001111" to start permanent writing into the non-volatile memory elements 5.

During the programming phase, the programming mode of the circuit architecture of this invention is entered, and checking the effect of the entered word on the parameters undergoing trimming will require no change to the operational mode of the circuit architecture.

The first and most significant bit MSB is the first bit to be entered. In the memory word 25, bits A3, . . . , A0 represent the field ADDRESS and identify the address of the parameter to be modified. Indeed, bits D3, . . . , D0 represent the field DATA (or tuning bit) and the data which, once written in the corresponding memory module, would modify the identified trimming parameter as desired.

As a memory word 25 is entered, the bits of the field DATA are stored into an appropriate module of the volatile memory block 2. The appropriate module is identified by the field ADDRESS.

The bits of the field DATA are held at that memory location until the device is turned off.

The circuit architecture of this invention allows essentially three operations to be performed, as specified herein below.

1) Loading, i.e. entering the memory words 25 and loading the related fields DATA into the volatile memory block 2. This operation affects a whole addressed module. At the end of the operation, the programming bits are present on the corresponding trimming outputs.

A measurement of the modified parameter can be made, several loading operations can be performed sequentially and/or one module can be acted upon repeatedly, by overwriting the previously entered data, without changing the device operational mode. During this operation, the device should be in the programming mode.

2) Zapping, i.e. fuse blowing. The data in the volatile memory block 2 is dumped permanently into the non-volatile memory block 3. The operation affects all the memory modules sequentially. The device should be in the programming mode also during this operation.

3) Reading, i.e. initializing the latch elements 4 at power-on of the device or at the simulation phase. The operation is carried out during the successive phases of sensing the state of the fuses and of writing this state into the latch elements 4 of the memory block 2. The operation affects all the memory modules sequentially.

It will be appreciated from the foregoing description that the circuit architecture of a preferred embodiment of this invention does solve the technical problem and allows to perform the trimming on an application board or a Final Testing Trimming, thereby affording the advantages listed herein below:

the implementation of an extremely simple interface protocol which uses a memory word of only eight bits;

the use of a dedicated memory word (zapping word) to activate the non-volatile memory elements to be permanently written;

no need of an internal clock, which makes the invention also useful with devices which do not incorporate any integrated oscillator; and high modularity, which makes the system easy to shrink or expand according to the number of memory elements to be programmed.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A circuit architecture for performing a trimming operation on an application board or after the operation of packaging an integrated electronic device, the circuit architecture comprising:

at least one non-volatile memory unit having non-volatile memory elements and a means for modifying the state of the non-volatile memory elements;

a first multifunctional input pin for receiving a sequence of trimming data;

at least one access pin;

at least one volatile memory unit being selectively coupled to the at least one non-volatile memory unit, wherein the at least one volatile memory unit is an addressable volatile memory unit;

a second multifunctional input pin for receiving a timing signal of acquisition of the sequence of trimming data; and an interface between the first multifunctional input, the second multifunctional input pin, the least one non-volatile memory unit, and the at least one volatile memory unit, in order to allow the sequence of trimming data to be received and stored into the at least one volatile memory unit with data acquisition being timed by the timing signal, the access pin serving to switch the circuit architecture operation from a normal mode to a trimming mode.

2. A circuit architecture according to claim 1, wherein the interface comprises a comparator block for comparing the sequence of trimming data with a predetermined string of bits, the comparator block output being coupled to the means for modifying the state of the memory elements via logic gates arranged also to receive a signal from a counter electrically coupled to the second multifunctional input pin.

3. A circuit architecture according to claim 2, wherein the predetermined string of bits is divided into a data field and an address field.

4. A circuit architecture according to claim 2, wherein the interface comprises a shift register electrically coupled to the first multifunctional input pin, the shift register being electrically coupled to inputs of the at least one volatile memory unit through a buffer and a multiplexer.

5. A circuit architecture according to claim 4, wherein the output of the comparator block is electrically coupled to the buffer through one of the logic gates to provide a signal enabling the trimming data sequence to be transferred.

6. A circuit architecture according to claim 1, wherein the interface comprises a comparator block for comparing the sequence of trimming data with a predetermined string of bits that is divided into a data field and an address field.

7. A circuit architecture according to claim 1, wherein the at least one volatile memory unit comprises elements of the D-latch type which are electrically coupled bi-directionally to the non-volatile memory elements.

8. A circuit architecture according to claim 1, wherein the interface comprises a counter electrically coupled to the second multifunctional input pin and electrically coupled to the means for modifying the state of the non-volatile memory elements through at least one logic gate.

9. A circuit architecture according to claim 1, wherein the circuit architecture is resident in, and is for performing a trimming operation directly on, one of the following: an application circuit board, and a packaged integrated electronic circuit device.

10. A circuit architecture according to claim 1, wherein the non-volatile memory elements comprise polysilicon fuses.

11. A method of performing a trimming operation, the method comprising the steps of:

in response to an operating mode select signal at an access pin, switching a mode of operation from normal mode to trimming mode;

receiving a sequence of trimming data via a first multifunctional input pin;

receiving a timing signal via a second multifunctional input pin;

timing acquisition of the sequence of trimming data with the timing signal;

storing the received sequence of trimming data in a volatile memory, the volatile memory being associated with at least one non-volatile memory unit having non-volatile memory elements and a means for modifying the state of the non-volatile memory elements; and performing a trimming operation by modifying the state of the non-volatile memory elements, based at least in part on trimming data stored in the volatile memory, following a match of a predetermined string of bits with a received sequence of trimming data.

12. The method of claim 11, further comprising the step of:
- at a power-on/initializing mode, storing the state of the non-volatile memory elements in the volatile memory.

13. The method of claim 11, wherein the trimming operation is carried out sequentially on one non-volatile memory element at a time.

14. An integrated circuit for performing a trimming operation, the integrated circuit comprising:
- at least one non-volatile memory unit;
- a volatile memory unit selectively coupled to the at least one non-volatile memory unit;
- a first multifunctional input pin for receiving a sequence of trimming data;
- a second multifunctional input pin for receiving a timing signal of acquisition of the trimming data;
- at least one access pin;
- an interface circuit, electrically coupled to the first multifunctional input pin, the second multifunctional input pin, the at least one non-volatile memory unit, and the at least one volatile memory unit, in order to allow,
    - in response to a trimming mode selection signal at the at least one access pin, receiving a sequence of trimming data via the first multifunctional input pin, the receiving of the sequence being timed by a timing signal being received via the second multifunctional input pin, and
        - when the received trimming data is not determined to be a zap signal, storing the received trimming data into the at least one volatile memory unit, and
        - when the received trimming data is determined to be a zap signal, storing a representation of the trimming data that is stored in the at least one volatile memory unit into a corresponding at least one non-volatile memory unit for effecting a trimming operation, and
    - in response to a normal mode selection signal at the at least one access pin, the electronic circuit operating in a normal mode with the first multifunctional input pin and the second multifunctional input pin both switched disable from use in trimming mode.

15. The integrated circuit of claim 14, wherein in response to a normal mode selection signal at the at least one access pin, at least one of the first multifunctional input pin and the second multifunctional input pin being switched to enable use thereof in normal mode.

16. The integrated circuit of claim 14, wherein the zap signal comprises a predetermined string of bits, and wherein the interface circuit comprises a comparator block for comparing the sequence of trimming data with the predetermined string of bits, the comparator block output being coupled to a means for modifying the state of memory elements of the at least one non-volatile memory unit via logic gates arranged also to receive a signal from a counter electrically coupled to the second multifunctional input pin.

17. The integrated circuit of claim 16, wherein the predetermined string of bits is divided into a data field and an address field.

18. The integrated circuit of claim 16, wherein the interface circuit comprises a shift register electrically coupled to the first multifunctional input pin, the shift register being electrically coupled to inputs of the at least one volatile memory unit through a buffer and a multiplexer.

19. The integrated circuit of claim 18, wherein the output of the comparator block is electrically coupled to the buffer through one of the logic gates to provide a signal enabling the sequence of trimming data to be transferred.

20. The integrated circuit of claim 14, wherein the interface circuit comprises a comparator block for comparing the sequence of trimming data with a predetermined string of bits that is divided into a data field and an address field.

21. The integrated circuit of claim 14, wherein the at least one volatile memory unit comprises elements of the D-latch type which are electrically coupled bi-directionally to the non-volatile memory elements.

22. The integrated circuit of claim 14, wherein the interface circuit comprises a counter electrically coupled to the second multifunctional input pin and electrically coupled to the means for modifying the state of the non-volatile memory elements through at least one logic gate.

23. The integrated circuit of claim 14, wherein the non-volatile memory elements comprise polysilicon fuses.

* * * * *